US008652929B2

(12) United States Patent
Huang et al.

(10) Patent No.: US 8,652,929 B2
(45) Date of Patent: Feb. 18, 2014

(54) CMOS DEVICE FOR REDUCING CHARGE SHARING EFFECT AND FABRICATION METHOD THEREOF

(75) Inventors: Ru Huang, Beijing (CN); Fei Tan, Beijing (CN); Xia An, Beijing (CN); Qianqian Huang, Beijing (CN); Dong Yang, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/582,034

(22) PCT Filed: Apr. 16, 2012

(86) PCT No.: PCT/CN2012/074076
§ 371 (c)(1),
(2), (4) Date: Aug. 30, 2012

(87) PCT Pub. No.: WO2013/091331
PCT Pub. Date: Jun. 27, 2013

(65) Prior Publication Data

US 2013/0161757 A1 Jun. 27, 2013

(30) Foreign Application Priority Data

Dec. 23, 2011 (CN) .......................... 2011 1 0436842

(51) Int. Cl.

*H01L 21/00* (2006.01)
*H01L 21/02* (2006.01)
*H01L 21/3063* (2006.01)
*H01L 21/84* (2006.01)

(52) U.S. Cl.

CPC .... *H01L 21/02203* (2013.01); *H01L 21/02216* (2013.01); *H01L 21/3063* (2013.01)
USPC .................... 438/409; 257/369; 257/E21.565

(58) Field of Classification Search

CPC ................... H01L 21/76245; H01L 21/02203; H01L 21/0203; H01L 21/02216; H01L 21/3063; C25D 1/32
USPC ........................................................ 438/409
See application file for complete search history.

(56) References Cited

U.S. PATENT DOCUMENTS 4,104,090 A * 8/1978 Pogge .......................... 438/409
(Continued)

FOREIGN PATENT DOCUMENTS

CN 1152798 A 6/1997
(Continued)

OTHER PUBLICATIONS

International Search Report dated Sep. 27, 2012, issued in corresponding International Application No. PCT/CN2012/074076.

*Primary Examiner* — Tom Thomas
*Assistant Examiner* — John Bodnar
(74) *Attorney, Agent, or Firm* — Bozicevic, Field & Francis LLP; Bret E. Field

(57) ABSTRACT

The present invention discloses a CMOS device of reducing charge sharing effect and a fabrication method thereof. The present invention has an additional isolation for trapping carriers disposed right below an isolation region. the material of the additional isolation region is porous silicon. Since porous silicon is a functional material of spongy structure by electrochemistry anodic oxidizing monocrystalline silicon wafer, there are a large number of microvoids and dangling bonds on the surface layer of the porous silicon. These defects may form defect states in a center of forbidden band of the porous silicon, the defect states may trap carriers so as to cause an increased resistance. And with an increase of density of corrosion current, porosity increases, and defects in the porous silicon increase. The present invention can reduce the charge sharing effect due to heavy ions by using a feature that the defect states in the porous silicon trap carriers, the formation of a shallow trench isolation (STI) region and a isolation region underneath only needs one time photolithography, and the process is simple, so that radioresistance performance of an integrated circuit may be greatly increased.

6 Claims, 6 Drawing Sheets

10
6
8
7
4
9
5
3
1

(56) References Cited

U.S. PATENT DOCUMENTS

| | | | | |
|---|---|---|---|---|
| 4,282,648 | A | 8/1981 | Yu et al. | |
| 6,146,977 | A | 11/2000 | Sera | |
| 2001/0036690 | A1 * | 11/2001 | Maeda | 438/151 |
| 2004/0094784 | A1 | 5/2004 | Rhodes et al. | |
| 2005/0090073 | A1 | 4/2005 | Hawley et al. | |
| 2007/0001227 | A1 * | 1/2007 | Barbe et al. | 257/347 |
| 2007/0012574 | A1 * | 1/2007 | Rauh-Adelmann et al. | 205/175 |
| 2008/0274596 | A1 * | 11/2008 | Matsumoto et al. | 438/154 |
| 2009/0255820 | A1 * | 10/2009 | Buttard | 205/123 |

FOREIGN PATENT DOCUMENTS

| | | | | |
|---|---|---|---|---|
| CN | 101667576 A | | 3/2010 | |
| CN | 101752376 A | | 6/2010 | |
| CN | 102130058 A | | 7/2011 | |
| WO | WO03065422 | * | 8/2003 | H01I 21/00 |

* cited by examiner a
1
2
b

Figure 4（a）

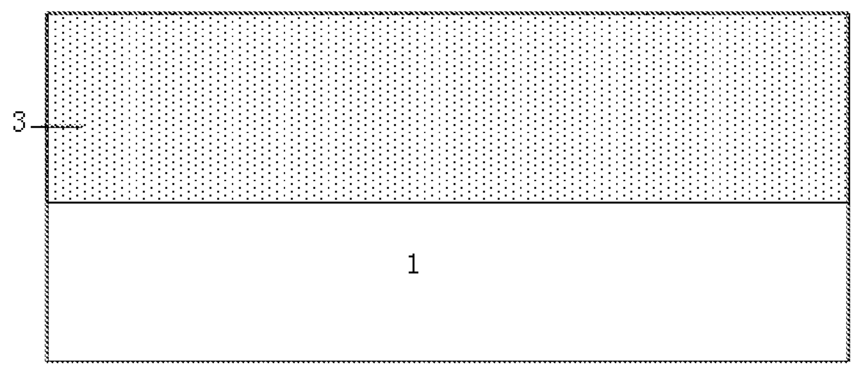
Figure 4（b）
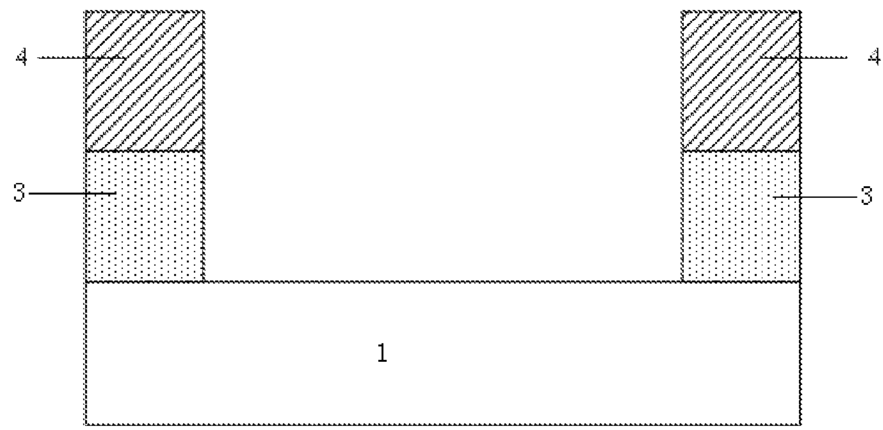
Figure 4（c）
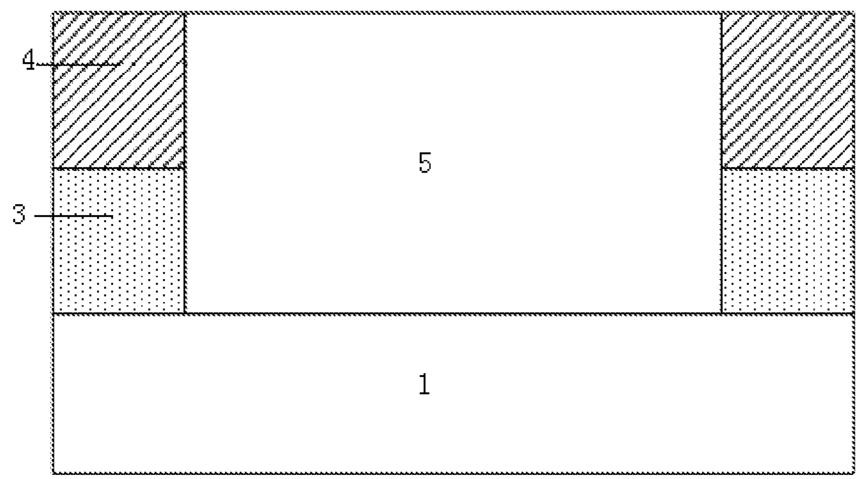
Figure 4（d）

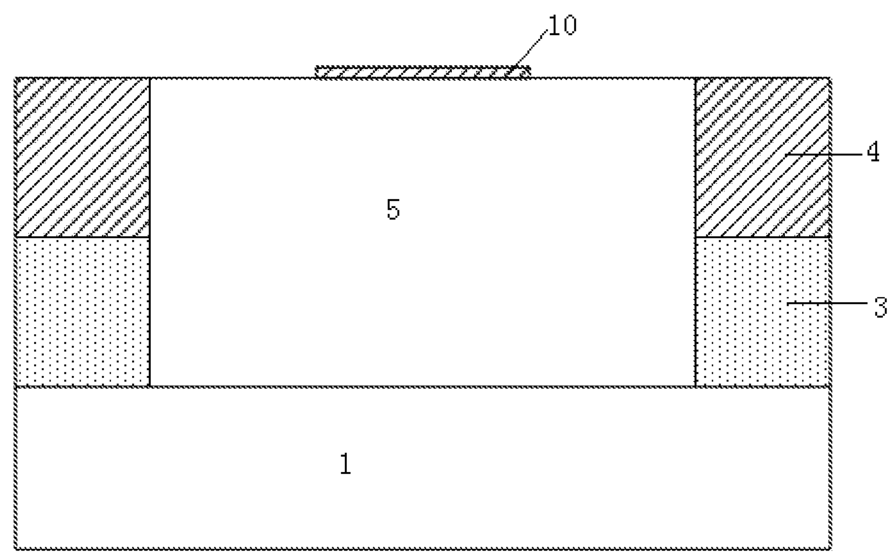
Figure 4（e）
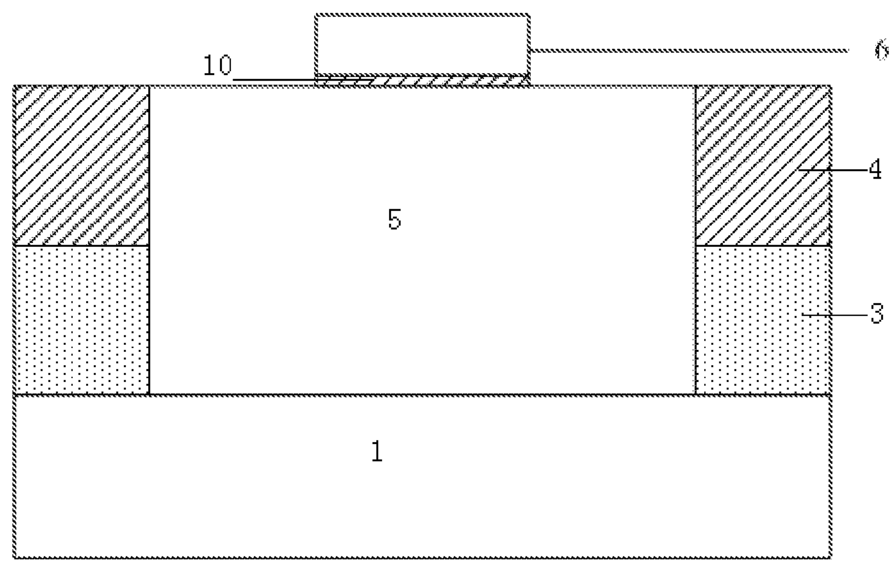
Figure 4（f）

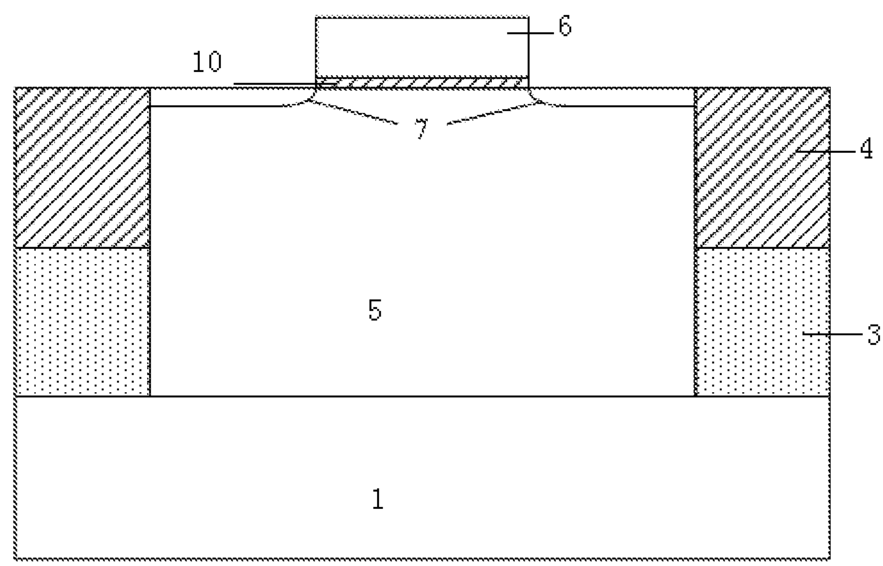
Figure 4（g）
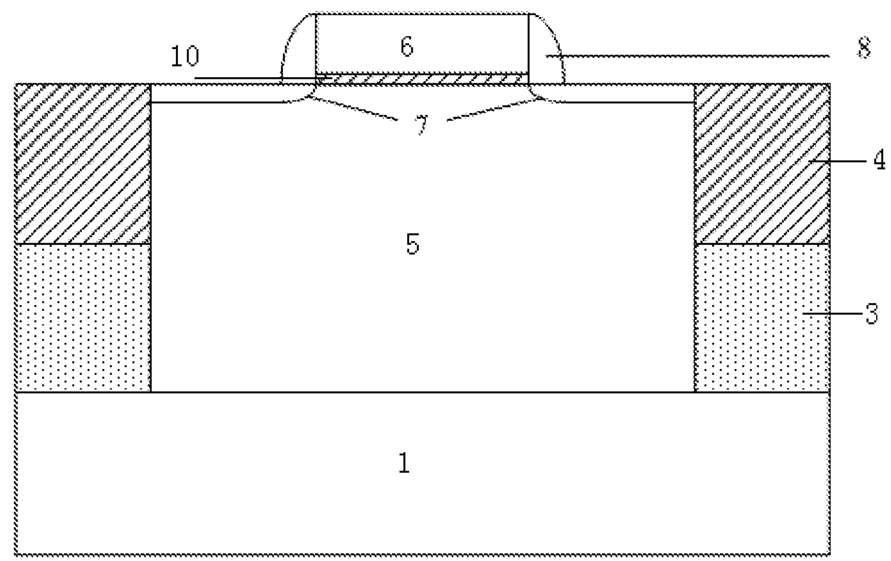
Figure 4（h）

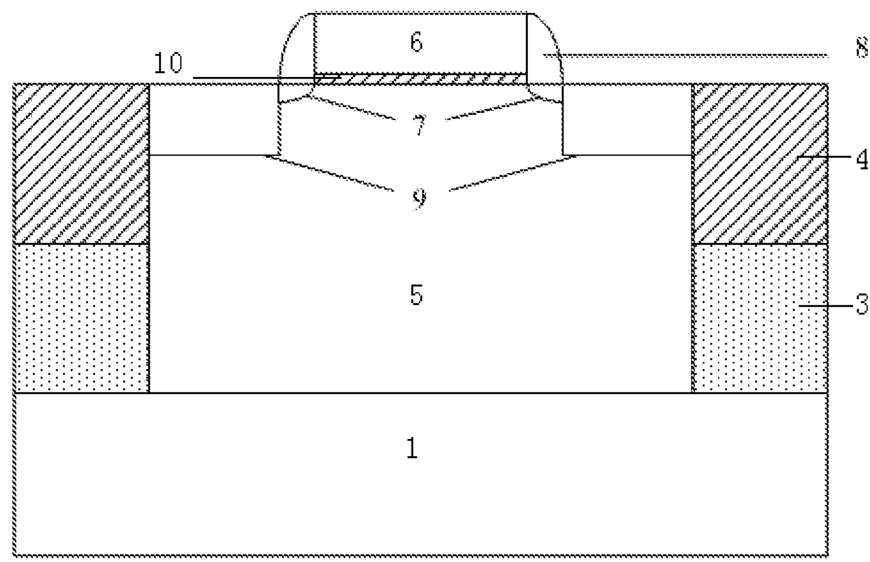
Figure 4（i）

CMOS DEVICE FOR REDUCING CHARGE SHARING EFFECT AND FABRICATION METHOD THEREOF

CROSS REFERENCE OF THE INVENTION

The present application claims priority to Chinese application No. 201110436842.8, filed on Dec. 23, 2011, which is incorporated herein by reference.

FIELD OF THE INVENTION

The present invention relates to a CMOS device, particularly relates to a CMOS device for reducing a charge sharing effect in a radiation environment and a fabrication method thereof.

BACKGROUND OF THE INVENTION

With a continuous development of the semiconductor technology, the size of integrated circuit element device has been less than 100 nm. When high energy charged ions from the aerospace or the ground pass through the integrated circuit element device, a large number of electron hole pairs deposited in the track are collected by sensitive nodes (i.e. reversed biased pn junctions) of the integrated circuit element device, which causes an improper variation of logic states of the element device or damage to the element device. For conventional integrated circuit element devices, spaces between the element devices are large. An electron hole pair along the track of charged ions generally can only be collected by one sensitive node of an element device. However, in order to increase the integration density of the integrated circuit, spaces between the element devices are continuously reduced, the electron hole pair along the track of charged ions diffuse into other element devices before recombination and will be collected in the vicinity of other sensitive nodes, and this phenomenon is referred as a charge sharing effect. The charge sharing effect may cause multiple nodes in the integrated circuit switch simultaneously, increase a switching section, and reduce an energy threshold required for the switching. Also, the charge sharing effect causes a failure of a radiation hardening technology at a device level and a circuit level such as the guard-rings.

As shown in FIG. 1, when heavy ions enter into a conventional CMOS device of small size, due to the influence of heavy ions, an electron hole pair 04 generated near the heavy ion incidence track 05 diffuses from an incidence main device 02 to a device 03 near the incidence main device 02, an isolation region 01 of the conventional device can not suppress the charge sharing effect during the heavy ion radiation.

SUMMARY OF THE INVENTION

In order to overcome the problems such as the multiple node switching and the failure of the radiation hardening technology due to the small spaces between devices, the present invention proposes a CMOS device capable of reducing the problem that charges are commonly colleted by a plurality of device when a single particle penetrates into one device.

An object of the present invention is to provide a CMOS device capable of suppressing the charge sharing effect in an ion radiation environment.

The device of the present invention includes a substrate, an isolation region, an active region, a gate region, a LDD (lightly dope drain) region, a gate sidewall, a source region and a drain region, wherein, an additional region for trapping carriers is disposed under the isolation region.

The material of the additional isolation region is porous material with dangling bonds, such as the porous silicon.

Another object of the present invention is to provide a fabrication method of the CMOS device capable of suppressing the charge sharing effect in a radiation environment.

The fabrication method of the CMOS device of the present invention includes the following steps.

1) A silicon wafer is provided as a substrate, and a front surface of the substrate is polished to form a mirror surface. After a typical cleaning process, an aluminum film is evaporated on the back of the substrate as an ohmic contact, and an acid proofing protection layer is coated over the aluminum film.

2) The silicon wafer is put into a mixed solution of the hydrofluoric acid and ethanol, and the aluminum film on the back of the substrate is used as an anode, and a platinum slice is used as an cathode. The silicon wafer is etched with a constant current. The silicon wafer is taken out after etching and then a cleaning process is performed. The aluminum on the back of the silicon wafer is removed to form a silicon-porous silicon as an additional isolation region.

3) A silicon oxide layer is grown over the additional isolation region through a thermal oxidation process and an isolation region for the device is remained after etching and photolithography.

4) A semiconductor material layer, such as silicon, is epitaxially grown and the semiconductor material layer is planarized to form an active region of the device.

5) A thin gate dielectric material layer, such as silicon oxide or high K material, is thermally oxidized and a gate dielectric of the device is formed after a photolithography process.

6) A mask oxide layer is grown and a material for gate, such as polysilicon or metal is deposited. A gate pattern is formed after a photolithography process, the material of the gate is etched to form the gate region of the device.

7) A LDD region is formed by performing an implantation process.

8) A material for a gate sidewall, such as silicon oxide or silicon nitride, is deposited. An anisotropic etching is performed to form the gate sidewall.

9) A source and drain region is formed by performing a source and drain implantation, and an annealing process is performed to activate the impurities.

The present invention has the following effect.

The present invention has porous material with dangling bonds disposed right below the isolation region, such as the additional isolation region of porous silicon. Since the porous silicon is a functional material of spongy structure formed by electrochemistry anodic oxidizing a monocrystalline silicon wafer, there are a large number of microvoids and dangling bonds on the surface of the porous silicon. These defects may form defect states in the forbidden band of the porous silicon, and the defect states may trap carriers so as to cause an increased resistance. With an increase of density of etching current, the porosity increases and the number of the defects in the porous silicon increases. The present invention can reduce the charge sharing effect due to heavy ions by using a fact that the defect states in the porous silicon can trap carriers. Moreover, the formation of a shallow trench isolation (STI) region and an isolation region underneath only needs one time photolithography, and the process is simple, so that the radiation-hardened performance of an integrated circuit may be greatly increased.

BRIEF DESCRIPTION OF THE DRAWINGS

FIGS. 4(*a*) to 4(*i*) are flow diagrams showing a fabrication method of a CMOS device according to an embodiment of the present invention.

DETAILED DESCRIPTION OF THE EMBODIMENTS

The embodiments of the present invention will now be illustrated in detail in conjunction with attached drawings.

Figure 1:
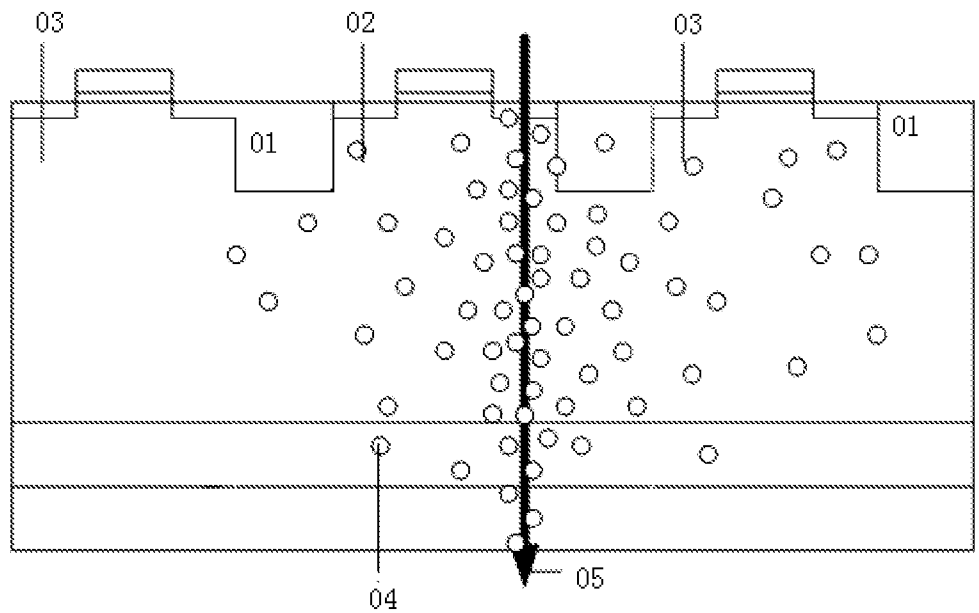
FIG. 1 is a schematic diagram showing that when heavy ions penetrates into a small size conventional CMOS device, a conventional isolation region can not inhibit the charge sharing effect during the heavy-ion irradiation.
Figure 2:
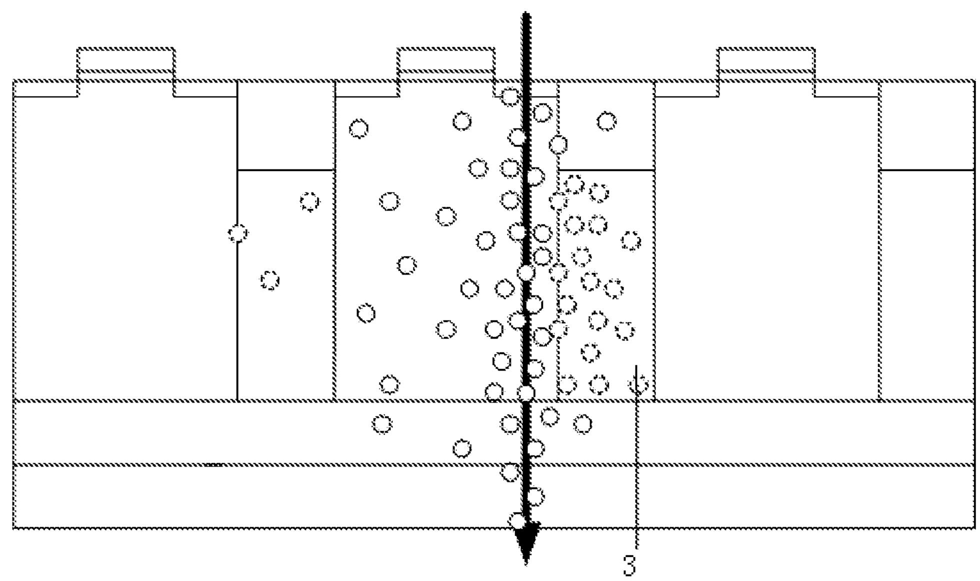
FIG. 2 is a schematic diagram showing that, after an additional isolation region formed of the porous silicon is added under the isolation region of the conventional CMOS device, electron hole pairs ionized from the heavy ions during the incidence to the device are trapped in the additional isolation region formed of the porous silicon when the electron hole pairs diffuse into a region near the device.

As shown in FIG. 2, a NMOS device is described as an example. Due to the ionization process produced by heavy ions, a large number of electron hole pairs will be formed along the track of the heavy ions. The holes move to the substrate, one portion of electrons are collected by sensitive nodes of the device to which the heavy ions are incident, and the other portion of electrons diffuse from a lower portion of an isolation region (e.g. STI region) to sensitive nodes of nearby devices and are collected. Therefore, an additional isolation region 3 of porous silicon material is disposed under the isolation region of the device, so that electrons or holes are trapped when diffusing toward nearby devices, the number of the electrons and the holes reaching the sensitive nodes of nearby devices is reduced, and thus the charge sharing effect can be effectively inhibited.

Figure 3:
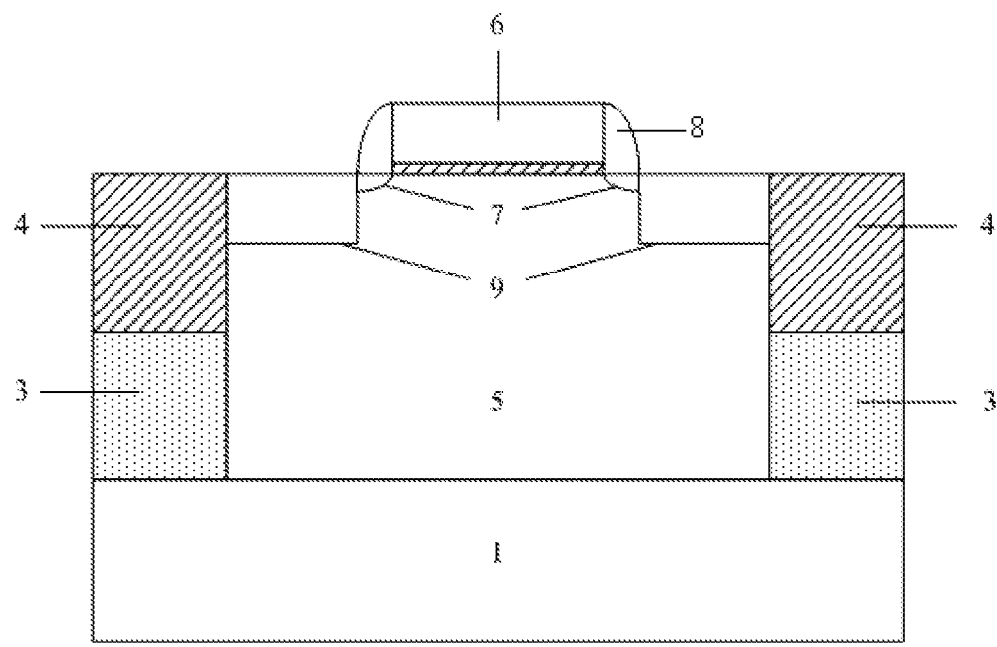
FIG. 3 is a cross-section diagram showing a CMOS device for reducing the charge sharing effect in a radiation environment of the present invention.

As shown in FIG. 3, the CMOS of the present invention includes a substrate 1, an isolation region 4, an active region 5, a gate region 6, a LDD region 7, a gate sidewall 8, a source/drain region 9, wherein an additional isolation region 3 is disposed right under the isolation region, the material of the additional isolation region is porous silicon.

A fabrication method of the device of the present invention will be further described by taking an NMOS device as an example. The method includes the following steps.

1) A P-type silicon wafer with a crystal orientation (100) is provided as a substrate 1, and the top surface of the substrate is chemical polished as a mirror surface. After a regular cleaning process, aluminum is evaporated onto the back surface b to form an aluminum film used as an ohmic contact, and an acid proof layer is coated over the aluminum film, as shown in FIG. 4(*a*).

2) The silicon wafer is putted into a mixed solution of hydrofluoric acid and alcohol, the aluminum film on the back surface b is used as an anode, a platinum piece is used as a cathode, a constant current of 100 mA/cm$^2$ is used, and the etching time is 20~25 min. The silicon wafer is picked out after etching and a clean process is performed, the aluminum on the back surface of the silicon wafer is etched to form a silicon-porous silicon 3, as shown in FIG. 4(*b*).

3) A silicon oxide layer is deposited on the porous silicon 3, a photolithography process is performed to form a pattern of a STI region and an isolation region 4 of the device is remained, as shown in FIG. 4(*c*).

4) A silicon layer is epitaxially grown and planarizized to form an active region 5 of the device, as shown in FIG. 4(*d*).

5) A thin silicon oxide layer is grown through a thermal oxidation and is etched to form a gate dielectric 10 of the device, as shown in FIG. 4(*e*).

6) A mask oxide layer is grown and the polysilicon is deposited, a photolithography process is performed to form a gate pattern, and the polysilicon is etched to form a gate region 6 of the device, as shown in FIG. 4(*f*).

7) A LDD region 7 is formed by implanting phosphorus or arsenic, as shown in FIG. 4(*g*).

8) A silicon oxide is deposited and a gate sidewall 8 is formed by an anisotropic etching, as shown in FIG. 4(*h*).

9) A source/drain region 9 is formed by implanting phosphorus or arsenic into the source/drain region, and an annealing process is performed to activate impurities, as shown in FIG. 4(*i*).

Finally, it is to be noted that, the embodiments are disclosed to aid for further understanding of the present invention. However, those skilled in the art of field will appreciate that various substitutions and modifications are possible without departing form the spirit and scope of the present invention and the attached claims. Therefore, the present invention should not be limited to the content disclosed in the embodiments, and the scope to be protected by the present invention depends on the scope defined by the claims.

What is claimed is:

1. A fabrication method of a CMOS device for reducing a charge sharing effect in a radiation environment, wherein, comprising:

1) providing a silicon wafer as a substrate (1), and polishing a front surface of the substrate into a mirror surface, and after a typical cleaning process, evaporating aluminum on a back surface of the substrate to form an aluminum film as an ohmic contact, and coating an acid-proofing protection layer over the aluminum film;
2) putting the silicon wafer into a mixed solution of hydrofluoric acid and ethanol, and using the aluminum film on the back surface of the substrate as an anode and using a platinum slice as a cathode, etching the silicon wafer with a constant current, picking out the silicon wafer after etching and performing a cleaning process, etching the aluminum on the back surface of the silicon wafer, and forming a layer of porous silicon to form an additional isolation region (3);
3) growing a silicon oxide layer over the additional isolation through a thermal oxidation process and performing an etching process after a photolithography process to form an isolation region (4) of a device;
4) epitaxially growing a semiconductor material layer, and planarizing the semiconductor material layer to form an active region (5) of the device;
5) thermally oxidizing a thin gate dielectric material layer and forming a gate dielectric of the device after a photolithography process;
6) growing a mask oxide layer and depositing a material of a gate, forming a gate pattern after a photolithography process, etching the material of the gate to form a gate region (6) of the device;
7) forming a LDD region (7) by performing an implantation process;
8) depositing a material of a gate sidewall, and performing an anisotropic etching to form a gate sidewall (8);
9) forming a source and drain region (9) by performing a source and drain implantation, and performing an annealing process to activate impurities.

2. The fabrication method of claim 1, wherein, in the step 4), the semiconductor material is silicon.

3. The fabrication method of claim 1, wherein, in the step 5), the material of the gate dielectric is silicon oxide or high K material.

4. The fabrication method of claim 1, wherein, in the step 6), the material of the gate is polysilicon or metal.

5. The fabrication method of claim 1, wherein, in the step 8), the material of the gate sidewall is silicon oxide or silicon nitride.

6. The fabrication method of claim 1, wherein, in the step 2), the constant current is 100 mA/cm$^2$ and the etching time is 20~25 min.

* * * * *